United States Patent
Hirai et al.

(10) Patent No.: US 6,861,377 B1
(45) Date of Patent: Mar. 1, 2005

(54) SURFACE TREATMENT METHOD, SURFACE-TREATED SUBSTRATE, METHOD FOR FORMING FILM PATTERN, METHOD FOR MAKING ELECTRO-OPTICAL DEVICE, ELECTRO-OPTICAL DEVICE, AND ELECTRONIC APPARATUS

(75) Inventors: Toshimitsu Hirai, Chino (JP); Hironori Hasei, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/386,447

(22) Filed: Mar. 13, 2003

(30) Foreign Application Priority Data

Mar. 27, 2002 (JP) .......................................... 2002-089810
Mar. 10, 2003 (JP) .......................................... 2003-063366

(51) Int. Cl.$^7$ .......................... H01L 21/31; H01L 21/469
(52) U.S. Cl. .......................... 438/781; 438/149; 438/758
(58) Field of Search ............................ 438/149, 689, 438/758, 781

(56) References Cited

U.S. PATENT DOCUMENTS

| | | | |
|---|---|---|---|
| 3,876,424 A | * | 4/1975 | Inoue et al. ................. 430/118 |
| 5,132,248 A | | 7/1992 | Drummond et al. |
| 6,521,200 B1 | * | 2/2003 | Silveston et al. ......... 423/512.1 |
| 6,540,335 B2 | * | 4/2003 | Touge et al. .................. 347/65 |
| 2002/0151161 A1 | * | 10/2002 | Furusawa .................... 438/597 |
| 2003/0003748 A1 | * | 1/2003 | Khan et al. .................. 438/694 |
| 2003/0085057 A1 | * | 5/2003 | Hashimoto .................. 174/261 |
| 2003/0203643 A1 | * | 10/2003 | Hasei et al. ................. 438/758 |
| 2004/0041753 A1 | * | 3/2004 | Nakanishi ..................... 345/76 |

FOREIGN PATENT DOCUMENTS

| | | |
|---|---|---|
| JP | A-59-75205 | 4/1984 |
| JP | A-2002-23356 | 1/2002 |

* cited by examiner

*Primary Examiner*—Amir Zarabian
*Assistant Examiner*—Pamela E Perkins
(74) *Attorney, Agent, or Firm*—Oliff & Berridge, PLC

(57) ABSTRACT

The invention provides a surface treatment method by which a substrate with desired uniform lyophilicity is obtained in order to enhance the formation of a film pattern by an ink-jet process; a surface-treated substrate obtained by the surface treatment; and a method of forming a film pattern.

A surface of a substrate is subjected to lyophobic treatment by forming a self-assembled layer composed of organic molecules. The lyophobicity is then modified by ultraviolet irradiation or the like to obtain desired lyophobicity.

17 Claims, 4 Drawing Sheets

SURFACE TREATMENT METHOD, SURFACE-TREATED SUBSTRATE, METHOD FOR FORMING FILM PATTERN, METHOD FOR MAKING ELECTRO-OPTICAL DEVICE, ELECTRO-OPTICAL DEVICE, AND ELECTRONIC APPARATUS

BACKGROUND OF THE INVENTION

1. Field of Invention

The present invention relates to surface treatment methods, surface-treated substrates, methods of forming film patterns, etc. More particularly, the invention relates to a surface treatment method to obtain a substrate which is suitable to form conductive wiring films used for electrodes, antennas, electronic circuits, integrated circuits, etc., or to form film patterns, such as silicon film patterns, and which has desired uniform lyophilicity; a surface-treated substrate obtained by the surface treatment; a method of forming a film pattern, etc.

2. Description of Related Art

In order to form wiring used for electronic circuits, integrated circuits, or the like, for example, photolithographic processes are used. In a related art lithographic process, a sensitized material, referred to as a resist, is applied onto a substrate which is preliminarily coated with a conductive film, a circuit pattern is exposed and developed, and the conductive film is etched following the resist pattern to form wiring. The lithographic process requires large-scale equipment, such as vacuum devices, and complex steps. In the lithographic process, only a small percentage of the material is used, and most of the material needs to be disposed of, resulting in an increase in production cost.

In contrast, U.S. Pat. No. 5,132,248 discloses a method in which a liquid in which conductive fine particles are dispersed is pattern deposited directly onto a substrate by an ink-jet process, and the deposited material is formed into a conductive film pattern by heat treatment or laser irradiation. In such a method, photolithography is not required, the process is greatly simplified, and the amount of raw material used is decreased.

However, in order to use the deposited material as wiring, the conductive fine particles must be overlapped with each other to a certain extent to form a thick film. That is, unless the conductive fine particles are overlapped with each other, portions in which the conductive fine particles are not brought into contact with each other may cause disconnections, etc. If the film pattern has an insufficient thickness, the electrical resistance is increased, and the resulting wiring has poor conductivity.

In the method of directly pattern depositing a liquid in which conductive fine particles are dispersed onto a substrate by an ink-jet process, since the liquid in which conductive fine particles are dispersed is used, the amount of the conductive fine particles deposited is limited in view of viscosity during discharge, etc., when a certain amount of liquid is discharged. On the other band, if an attempt is made to discharge a large amount of liquid at one time, it becomes difficult to control the formation position of wiring and the wiring width increases, thus being unsuitable for integration of electronic circuits, etc.

In order to properly form a conductive wiring film by the ink-jet process, Japanese Unexamined Patent Application Publication No. 59-75205 discloses a method in which the positions of ejected droplets are controlled by placing banks (walls). By using the banks, even if a certain amount of liquid is discharged, the droplets discharged onto the substrate remain between the spaces between the banks, and it is possible to form lines with a line width of approximately 30 $\mu$m with a positional accuracy of approximately 1 $\mu$m.

However, such banks must be formed by a photolithographic process, resulting in an increase in the cost.

Another method is also disclosed in which a pattern of lyophobic regions and lyophilic regions is preliminarily formed on a substrate, and a liquid material is selectively discharged onto the lyophilic regions by the ink-jet process. In such a case, since the liquid in which conductive fine particles are dispersed easily accumulates in the lyophilic regions, it is possible to form lines while maintaining the positional accuracy without forming banks.

However, this method requires the forming of the pattern for the lyophilic regions and the lyophobic regions using a mask, etc., and also requires the placing of alignment marks in order to deposit the liquid accurately on the lyophilic pattern, resulting in a complex process.

Since wet droplets spread because of the discharge onto the lyophilic regions, it is difficult to form thick conductive films. In order to increase the thickness, the number of times to discharge may be increased. However, unless the lyophobicity of the lyophobic region to the liquid is considerably increased, it is difficult to confine the liquid within the lyophilic region. Furthermore, the line width of the wiring formed is limited by the width of the lyophilic region of the substrate.

In order to form a silicon thin film pattern used for integrated circuits and thin-film transistors, in general, after an amorphous or polysilicon film is formed over the entire surface of a substrate by thermal CVD, plasma CVD, photo-assisted CVD, or the like, unwanted portions of the silicon film are removed by photolithography.

However, in the formation process of the silicon thin film pattern using CVD and photolithography, further enhancements are desired for the reasons described below.

Since the vapor phase reaction is used and silicon particles are generated in the vapor phase, the production yield is decreased due to the contamination of the apparatus and generation of foreign matter.

Since the gaseous material is used, it is difficult to obtain a film with a uniform thickness on a substrate whose surface is irregular.

Since the formation rate of the film is slow, productivity is low.

In plasma CVD, complex and expensive high-frequency generators, vacuum devices, etc., are required.

In photolithography, the process is complex, the utilization ratio of the material is low, and a large amount of waste, such as resists and etchants, is generated.

In terms of materials, since toxic and highly reactive gaseous silicon hydride is used, handling is difficult, and sealed vacuum devices are required because it is gaseous. In general, such devices are large-scale and the devices themselves are expensive, and also a large amount of energy is consumed in the vacuum system and the plasma system, resulting in an increase in the production cost.

In contrast, another method is also disclosed in which a pattern of lyophobic regions and lyophilic regions is preliminarily formed on a substrate, a liquid material containing an organic silicon compound is selectively discharged only onto the lyophilic regions by an ink-jet process, and the deposited material is transformed into a silicon film pattern by heat treatment or the like. Thereby, a silicon film pattern is formed accurately by a simple process.

As described above, an attempt has been made to form a film pattern by discharging a liquid containing conductive fine particles or a component, such as an organic silicon compound, to form the film as droplets onto a substrate in which lyophilicity or lyophobicity is adjusted uniformly or a substrate provided with a pattern of lyophobic regions and lyophilic regions.

In such a case, related art examples of the lyophobic treatment include a process of forming a lyophobic monomolecular layer, such as a self-assembled layer composed of organic molecules, on the surface of the substrate, a process of forming a fluorinated polymer layer on the surface of the substrate, and plasma treatment using a fluorocarbon compound as a reactant gas.

On the other hand, related art examples of the lyophilic treatment include ultraviolet irradiation and plasma treatment using oxygen as a reactant gas.

SUMMARY OF THE INVENTION

When a film pattern is formed using the substrate in which lyophilicity or lyophobicity is adjusted uniformly, the contact angle between the liquid and the substrate must be set uniformly, for example, at 60 deg. In the case in which the substrate provided with a pattern of lyophobic regions and lyophilic regions is used, first, the substrate in which lyophilicity is adjusted uniformly is prepared, and the pattern of the lyophilic regions must be formed on the substrate.

However, in the related art lyophobic treatment described above, it is difficult to set the contact angle between the liquid and the substrate at less than 70 deg. For example, when an alkylsilane fluoride monomolecular layer is formed on a glass substrate, the contact angle between pure water and the substrate is approximately 110 deg. When plasma treatment is performed on a silicon wafer using methane tetrafluoride as a reactant gas, the contact angle between the solvent-based pigment ink and the substrate is approximately 70 deg.

For that reason, it is difficult to obtain desired lyophobicity, for example, with a contact angle of 60 deg or less, which is problematic to the formation of a film pattern by the inkjet process.

The present invention addresses the above and/or other problems, and provides a surface treatment method to obtain a substrate having desired uniform lyophilicity so that the formation of a film pattern by an ink-jet process is enhanced, a surface-treated substrate obtained by the surface treatment, and a method of making a film pattern, etc.

In order to address or achieve the above, in one aspect of the present invention, a surface treatment method includes performing lyophobic treatment on a surface of a substrate, followed by lyophilic treatment.

In accordance with the present invention, lyophobic treatment is performed sufficiently, and then the imparted lyophobicity is modified by lyophilic treatment. Consequently, desired lyophobicity can be obtained uniformly.

Preferably, the lyophobic treatment is performed by forming a lyophobic monomolecular layer on the surface of the substrate. As the lyophobic monomolecular layer, a self-assembled layer comprising organic molecules may be used. In such a case, the monomolecular layer can be formed easily.

Preferably, the lyophobic treatment is performed by forming a fluorinated polymer layer on the surface of the substrate. The fluorinated polymer layer may be easily formed by plasma treatment using a fluorocarbon compound as a reactant gas.

In the present invention, preferably, the lyophilic treatment, which is performed after the lyophobic treatment, is performed by ultraviolet irradiation. In such a case, since the lyophobic film formed can be broken partially and uniformly overall, the lyophobicity can be modified and desired lyophobicity can be obtained uniformly.

Preferably, the lyophilic treatment, which is performed after the lyophobic treatment, is performed also by plasma treatment using oxygen as a reactant gas. In such a case, since the lyophobic film formed can be modified partially and uniformly overall, the lyophobicity can be modified and desired lyophobicity can be obtained uniformly.

Preferably, the lyophilic treatment, which is performed after the lyophobic treatment, is performed also by exposing the substrate to an ozone atmosphere. In such a case, since the lyophobic film formed can be modified partially and uniformly overall, the lyophobicity can be modified and desired lyophobicity can be obtained uniformly.

In another aspect of the present invention, a surface-treated substrate is obtained by any one of the surface treatment methods of the present invention. Since the substrate of the present invention has desired uniform lyophobicity, a film pattern can be easily formed by an ink-jet process.

In another aspect of the present invention, a method of forming a film pattern includes discharging droplets of a liquid containing a component to form the film onto the surface-treated substrate of the present invention. In accordance with the present invention, since the droplets can be discharged onto the substrate having desired uniform lyophobicity, it is possible to form a film pattern of high quality.

The present invention is preferably applicable when the component to form the film contains conductive fine particles. In accordance with the present invention, it is possible to form a conductive wiring film with a large thickness which is advantageous to electrical conduction, in which defects, such as disconnections and short-circuiting, do not easily occur, and which can be formed finely.

In such a case, preferably, a heat treatment device or a phototreatment device which converts the component to form the film into a conductive film is used. Consequently, conductivity of the conductive fine particles can be exhibited, and a conductive film can be produced.

In another aspect of the present invention, a conductive wiring film is formed by any one of the methods of forming the film pattern of the present invention.

In accordance with the present invention, it is possible to form a conductive wiring film with a large thickness which is advantageous to electrical conduction, in which defects, such as disconnections and short-circuiting, do not easily occur, and which can be formed finely.

In another aspect of the present invention, an electro-optical device includes the conductive wiring film of the present invention. Examples of the electro-optical device of the present invention include liquid crystal display devices, organic electroluminescent display devices, and plasma display devices.

In another aspect of the present invention, an electronic apparatus includes the electro-optical device of the present invention.

In another aspect of the present invention, a contactless card medium includes the conductive wiring film of the present invention, the conductive wiring film functioning as an antenna circuit.

In accordance with the present invention, it is possible to provide a compact, thin electro-optical device in which defects, such as disconnections and short-circuiting, do not easily occur in wiring and antenna sections, an electronic apparatus including the same, and a contactless card medium.

BRIEF DESCRIPTION OF THE DRAWINGS

FIG. 3(a) shows a mobile phone provided with a liquid crystal display device in the fourth exemplary embodiment; FIG. 3(b) shows a portable information processing device provided with a liquid crystal display device in the fourth exemplary embodiment; and FIG. 3(c) shows a wristwatch-type information processing device provided with a liquid crystal display device in the fourth exemplary embodiment;

DETAILED DESCRIPTION OF PREFERRED EMBODIMENTS

Figure 1:
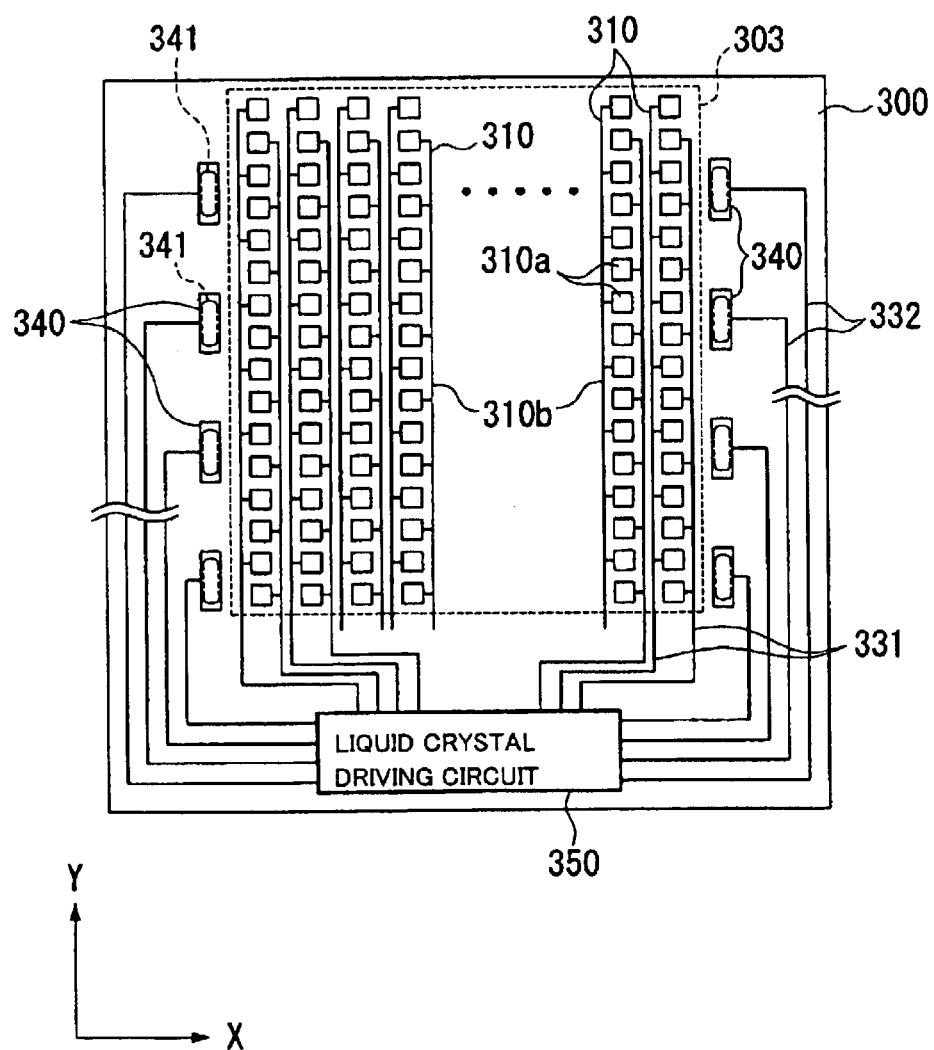
FIG. 1 is a plan view of a first substrate of a liquid crystal device in a fourth exemplary embodiment.

Exemplary embodiments of the present invention are described in detail below.

[First Exemplary Embodiment]

In a first exemplary embodiment, a surface treatment method of the present invention is described. The surface treatment method in this exemplary embodiment includes a lyophobic treatment step and a lyophilic treatment step. The individual steps are described below.

(Lyophobicity-Imparting Treatment)

In a lyophobic treatment method, a self-assembled layer including an organic molecular film is formed on a surface of a substrate.

An organic molecular film to treat a surface of a substrate contains, at one end, functional groups that are linkable to the substrate, at the other end, functional groups that modify the surface properties of the substrate such that the surface is lyophobic (i.e., control the surface energy), and straight carbon chains or partially branched carbon chains that combine the functional groups on both ends together. The organic molecular film links to the substrate and self-assembles to form a molecular film, such as a monomolecular layer.

A self-assembled layer includes bonding functional groups reactable with constituent atoms of an underlayer, such as a substrate, and straight chain molecules. The self-assembled layer is formed by orienting a compound having excellent orientation properties by the interaction of the straight chain molecules. In the self-assembled layer, since monomolecules are oriented, the thickness thereof can be significantly decreased, and moreover, the film is uniform at the molecular level. That is, since the same molecules are located on the surface of the film, it is possible to impart uniform and excellent lyophobicity, etc. to the surface of the film.

When a fluoroalkylsilane is used as the compound having excellent orientation properties, the individual compounds are oriented so that the fluoroalkyl groups are located at the surface of the film to form a self-assembled layer. Therefore, lyophobicity is imparted to the surface of the film uniformly.

Examples of the compound which forms such a self-assembled layer include fluoroalkylsilanes (hereinafter referred to as "FAS"s), such as heptadecafluoro-1,1,2,2-tetrahydrodecyltriethoxysilane, heptadecafluoro-1,1,2,2-tetrahydrodecyltrimethoxysilane, heptadecafluoro-1,1,2,2-tetrahydrodecyltrichlorosilane, tridecafluoro-1,1,2,2-tetrahydrooctyltriethoxysilane, tridecafluoro-1,1,2,2-tetrahydrooctyltrimethoxysilane, tridecafluoro-1,1,2,2-tetrahydrooctyltrichlorosilane, and trifluoropropyltrimethoxysilane. Preferably, the compound is used alone. Two or more of the compounds may be combined as long as the original object of the present invention is achieved without fail. In the present invention, preferably, the FAS is used as the compound to form the self-assembled layer in order to impart adhesion and satisfactory lyophobicity to the substrate.

The FAS is generally represented by the formula $R_nSiX_{(4-n)}$, where n is an integer of 1 to 3, and X is a hydrolyzable group, such as a methoxy group, ethoxy group, or halogen atom. R is a fluoroalkyl group and has the structure $(CF_3)(CF_2)_x(CH_2)_y$, (where x is an integer of 0 to 10 and y is an integer of 0 to 4). When plural numbers of R or X are bonded to Si, the individual R or X may be the same or different. The hydrolyzable group represented by X forms a silanol by hydrolysis and reacts with the hydroxyl group of the underlayer, such as a substrate (glass or silicon), and thereby is linked to the substrate by the siloxane bond. On the other hand, since R has a fluoro group, such as $(CF_3)$, on the surface, the surface of the underlayer, such as the substrate, is modified to be unwettable (have low surface energy).

A self-assembled layer including an organic molecular film is formed on a substrate by placing the raw material compound and the substrate in the same sealed container and leaving them to stand for 2 to 3 days at room temperature. By retaining the entire sealed container at 100° C., the self-assembled layer is formed on the substrate in approximately 3 hours. In the process described above, the film is formed from the vapor phase. A self-assembled layer may also be formed from the liquid phase. For example, a substrate is immersed in a solution containing a raw material compound, followed by cleaning and drying, to obtain a self-assembled layer on the substrate.

Additionally, before the self-assembled layer is formed, preferably, pretreatment is performed by irradiating the surface of the substrate with ultraviolet light or cleaning the surface of the substrate with a solvent.

In another lyophobic treatment method, plasma irradiation is performed at normal pressures or in a vacuum. Various gaseous species may be selected for the plasma treatment depending on the surface material of the substrate. For example, a fluorocarbon gas, such as methane tetrafuoride, perfluorohexane, or perfluorodecane, may be used as the raw gas. In such a case, a lyophobic fluorinated polymer layer is formed on the surface of the substrate.

The lyophobic treatment may be performed by attaching a film with desired lyophobicity, such as a polyimide film treated with tetrafluoroethylene, to a surface of a substrate. Additionally, a polyimide film itself may be used as a substrate.

(Lyophilicity-Imparting Treatment)

When the lyophobic treatment is completed, the surface of the substrate has higher lyophobicity than desired. Therefore, the lyophobicity is modified by lyophilic treatment.

In a lyophilic treatment method, irradiation of ultraviolet light of 170 to 400 nm is performed. Consequently, the lyophobic film formed can be broken partially and uniformly overall to modify the lyophobicity.

In such a case, the degree of lyophobicity modification can be adjusted by the irradiation time of ultraviolet light, and it may also be adjusted by the combination of the intensity of ultraviolet light, the wavelength, and heat treatment (heating), etc. This method also includes an ultraviolet irradiation step using a mask to decrease the lyophobicity. It is also possible to incorporate a material (e.g., titanium (Ti) as a metal) to accelerate the patterning time into the mask. Lyophilicity-imparting treatment may be performed by using such a mask to decrease the lyophobicity.

In another lyophilic treatment method, plasma treatment is performed using oxygen as a reactant gas. Consequently, the lyophobic film formed can be modified partially and uniformly overall to decrease the lyophobicity.

In another lyophilic treatment method, the substrate is exposed to an ozone atmosphere. Consequently, the lyophobic film formed can be modified partially and uniformly overall to decrease the lyophobicity.

In such a case, the degree of lyophobicity modification may be adjusted by the irradiation output, distance, time, etc.

[Second Exemplary Embodiment]

In a second exemplary embodiment, a method of forming wiring, which is an example of the method for forming the film pattern of the present invention, is described below. The method of forming wiring in this exemplary embodiment includes surface treatment, discharge, and heat treatment/phototreatment. The individual steps are described below.

(Surface Treatment)

As the substrate on which wiring composed of a conductive film is formed, a substrate composed of various types of materials may be used, such as a Si wafer, quartz glass, glass, a plastic film, and a metal sheet.

The substrate composed of such a material on which a semiconductor film, metal film, dielectric film, organic film, or the like, is formed as an underlayer may be used as the substrate to form the conductive wiring film.

Surface treatment is performed by the method in accordance with the first exemplary embodiment on the surface of the substrate to form the conductive wiring film so that the contact angle between the surface and a liquid containing conductive fine particles corresponds to a desired value.

The desired contact angle is appropriately selected depending on the specific method in the discharge step described below. For example, when droplets ate discharged so as to be overlapped with the previously discharged droplets, preferably, the contact angle is set at 30 to 60 deg.

In a discharge method in which a plurality of droplets are placed so as not to come into contact with each other by first discharging, and the spaces therebetween are filled by second and subsequent discharging, surface treatment is performed so that the contact angle is preferably set at 60 deg or more, and more preferably at 90 to 110 deg. Additionally, in such a case, in order to decrease the difference in the thickness due to the variations of the nozzles (variations in the discharge amount) as much as possible, desirably, in the first discharging, droplets are discharged from a first nozzle, and in the second discharging, droplets are discharged from a nozzle that is different from the first nozzle.

(Discharge)

When wiring is formed, the liquid discharged in the discharge is a liquid containing conductive fine particles. As the liquid containing conductive fine particles, a liquid obtained by dispersing conductive fine particles in a dispersion medium is used. Examples of the conductive fine particles used include metal fine particles containing any one of gold, silver, copper, palladium, and nickel, and fine particles of conductive polymers and superconductors.

In order to enhance dispersibility, the surfaces of such conductive fine particles may be coated with an organic substance or the like. As the coating agent to be applied to the surfaces of the conductive fine particles, for example, an organic solvent, such as xylene or toluene, or citric acid may be used.

The particle size of the conductive fine particle is preferably 5 nm to 0.1 $\mu$m. If the particle size is more than 0.1 $\mu$m, clogging easily occurs in the nozzle, resulting in difficulty in discharging in the ink-jet process. If the particle size is less than 5 nm, the volume ratio of the coating agent to the conductive fine particle is increased, and the percentage of the organic substance in the resultant film becomes excessive.

The dispersion medium for the liquid containing the conductive fine particles preferably has a vapor pressure of 0.001 to 200 mmHg (approximately 0.133 to 26,600 Pa) at room temperature. If the vapor pressure is higher than 200 mmHg, the dispersion medium rapidly vaporizes after discharging, and it is difficult to form a satisfactory film.

More preferably, the vapor pressure of the dispersion medium is 0.001 to 50 mmHg (approximately 0.133 to 6,650 Pa). If the vapor pressure is higher than 50 mmHg, clogging easily occurs in the nozzle due to drying when droplets are discharged in the ink-jet process, resulting in difficulty in stable discharging.

On the other hand, if the dispersion medium has a vapor pressure lower than 0.001 mmHg at room temperature, drying delays and the dispersion medium easily remains in the film. As a result, after the subsequent heat treatment and/or phototreatment, it is difficult to obtain a high-quality conductive film.

The dispersion medium used is not particularly limited as long as it disperses the conductive fine particles and does not cause aggregation. Examples thereof include, in addition to water, alcohols, such as methanol, ethanol, propanol, and butanol; hydrocarbon compounds, such as n-heptane, n-octane, decane, toluene, xylene, cymene, durene, indene, dipentene, tetrahydronaphthalene, decahydronaphthalene, and cyclohexylbenzene; ether compounds, such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, and p-dioxane; and polar compounds, such as propylene carbonate, $\gamma$-butyrolactone, N-methyl-2-pyrrolidone, dimethylformamide, dimethyl sulfoxide, and cyclohexanone. In view of dispersibility of the fine particles, stability of the dispersion liquid, and applicability to the ink-jet process, preferred examples are water, alcohols, hydrocarbon compounds, and ether compounds, and more preferred examples are water and hydrocarbon compounds. These dispersion media may be used alone, or two or more of them may be combined for use.

When the conductive fine particles are dispersed in the dispersion medium, the concentration of the dispersoid is 1% to 80% by mass and may be adjusted according to the desired thickness of the conductive film. If the concentration exceeds 80% by mass, aggregation easily occurs and it is difficult to obtain a uniform film.

The surface tension of the dispersion liquid of the conductive fine particles is preferably in the range of 0.02 to 0.07 N/m. When the liquid is discharged by the ink-jet process, if the surface tension is less than 0.02 N/m, the wettability of the ink composition to the nozzle surface increases, and flight curving easily occurs. If the surface tension exceeds 0.07 N/m, the shape of the meniscus at the nozzle tip becomes unstable, resulting in difficulty in controlling the amount and timing of the discharge.

In order to adjust the surface tension, a surface tension adjuster, such as a fluorochemical, silicone, or nonionic surface tension adjuster, may be added to the dispersion liquid in a slight amount so as not to decrease the contact angle with the substrate excessively. The nonionic surface tension adjuster enhances the wettability of the liquid to the substrate, enhances the leveling property of the film, and prevents the graininess and orange peel surface of the coated film.

The dispersion liquid may contain an organic compound, such as an alcohol, ether, ester, or ketone, as necessary.

The viscosity of the dispersion liquid is preferably 1 to 50 mPa·s. When discharging is performed by the ink-jet process, if the viscosity is less than 1 mPa·s, the periphery of the nozzle is easily contaminated by the spill of ink. If the viscosity exceeds 50 mPa·s, the frequency of nozzle port clogging increases, and it becomes difficult to discharge droplets smoothly.

In this exemplary embodiment, droplets of the dispersion liquid are ejected from an ink-jet head to drop on the substrate at the location where wiring is formed. In order to avoid generation of liquid pools (bulges), the degree of overlap between continuously discharged droplets must be controlled. A discharge method may be employed in which a plurality of droplets are discharged so as not to come into contact with each other by first discharging, and the spaces therebetween are filled by second and subsequent discharging.

In such a case, in order to decrease the difference in the thickness due to the variations of the nozzles (variations in the discharge amount) as much as possible, desirably, in the first discharging, droplets are discharged from a first nozzle, and in the second discharging, droplets are discharged from a nozzle that is different from the first nozzle.

After the droplets are discharged, in order to remove the dispersion medium, a drying process is performed as necessary. For example, the drying process may be performed using an ordinary hot plate for heating a substrate W, an electric furnace, or the like, or by lamp annealing. The light source used for lamp annealing is not particularly limited. For example, an infrared lamp, xenon lamp, YAG laser, argon laser, carbon dioxide gas laser, or an excimer laser using XeF, XeCl, XeBr, KrF, KrCl, ArF, ArCl, or the like, may be used as the light source. The light source with an output in the range of 10 to 5,000 W is usually used. In this embodiment, the output in the range of 100 to 1,000 W is sufficient.

(Heat Treatment/Phototreatment)

With respect to the dried film to which the discharge has been performed, the dispersion medium must be completely removed in order to achieve satisfactory electrical contact between the fine particles. When a coating agent, such as an organic substance, is applied to the surfaces of the conductive particles to improve the dispersibility, the coating agent must also be removed. For that purpose, the substrate is subjected to heat treatment and/or phototreatment after the discharge is performed.

The heat treatment and/or phototreatment is usually performed in the atmosphere, and may be performed in an inert gas atmosphere, such as nitrogen, argon, or helium, when necessary. The treating temperature of the heat treatment and/or phototreatment is appropriately set in consideration of the boiling point (vapor pressure) of the dispersion medium, the type and pressure of the atmospheric gas, thermal behavior, such as dispersibility and oxidizing property, of the fine particles, use of a coating agent, the amount of the coating agent if used, the heat-resisting temperature of the substrate, etc.

For example, in order to remove a coating agent composed of an organic substance, firing must be performed at approximately 300° C. When a substrate composed of a plastic or the like is used, firing is preferably performed at temperatures in the range of room temperature to 100° C.

The heat treatment and/or phototreatment may be performed using an ordinary hot plate, electric furnace, or the like, or by lamp annealing. The light source used to perform lamp annealing is not particularly limited. For example, an infrared lamp, xenon lamp, YAG laser, argon laser, carbon dioxide gas laser, or an excimer laser using XeF, XeCl, XeBr, KrF, KrCl, ArF, ArCl, or the like, may be used as the light source. The light source with an output in the range of 10 to 5,000 W is usually used. In this embodiment, the output in the range of 100 to 1,000 W is sufficient.

Electrical contact between the fine particles is ensured by the step described above for the dried film to which the discharge step has been performed, and the film is transformed into a conductive film.

With respect to the conductive film formed in this exemplary embodiment, since a substrate having properly adjusted lyophobicity is used, thin lines and thick films can be formed without generating bulges.

Consequently, in this exemplary embodiment, it is possible to form a conductive wiring film with a large thickness which is advantageous for electrical conduction, in which defects, such as disconnections and short-circuiting, do not easily occur, and which can be formed finely.

[Third Exemplary Embodiment]

In a third exemplary embodiment, a method of forming a silicon film pattern, which is an example of the method for forming the film pattern of the present invention, is described below. The method of forming the silicon film pattern in this exemplary embodiment includes surface treatment, discharge, and heat treatment/phototreatment. The individual steps are described below.

(Surface Treatment)

As the substrate on which a silicon thin-film pattern is formed, a substrate composed of various types of materials may be used, such as a Si wafer, quartz glass, glass, a plastic film, and a metal sheet. The substrate composed of such a material on which a semiconductor film, metal film, dielectric film, organic film, or the like, is formed as an underlayer may also be used as the substrate to form the silicon thin-film pattern.

The surface of the substrate to form the silicon thin-film pattern is subjected to surface treatment by the method in accordance with the first embodiment so that the contact angle between the surface and a liquid containing an organic silicon compound corresponds to a desired value.

The desired contact angle is appropriately selected depending on the specific method in the discharge described below. For example, when droplets are discharged so as to be overlapped with the previously discharged droplets, preferably, the contact angle is set at 30 to 60 deg. In a discharge method in which a plurality of droplets are placed so as not to come into contact with each other by first discharging, and the spaces therebetween are filled by second and subsequent discharging, surface treatment is performed so that the contact angle is preferably at 60 deg or more, and more preferably at 90 to 110 deg.

(Discharge)

When a silicon thin-film pattern is formed, the liquid discharged in the discharge is a liquid containing an organic silicon compound. As the liquid containing an organic silicon compound, a solution in which the organic silicon compound is dissolved in a solvent is used. The organic silicon compound used herein is a cyclic silane compound represented by the general formula $Si_nX_m$ (wherein X is a hydrogen atom and/or halogen atom, n is an integer of 3 or more, and m is an integer corresponding to n, 2n−2, 2n, or 2n+2).

Although n is 3 or more, in view of thermodynamic stability, solubility, ease of refinement, etc., a cyclic silane compound with n being approximately 5 to 20, and in particular, 5 or 6, is preferably used. If n is less than 5, the silane compound itself becomes unstable due to strain of the ring, resulting in difficulty in handling. If n exceeds 20, solubility decreases due to the cohesive force of the silane compound, and the choice of the solvent used is narrowed.

In the general formula $Si_nX_m$ of the silane compound used in the present invention, X is a hydrogen atom and/or halogen atom. Since the silane compound is a precursor compound to a silicon film, it must be finally converted into amorphous or polycrystalline silicon by heat treatment and/or phototreatment. The silicon-hydrogen bonds and/or silicon-halogen bonds are cleaved in the above treatment to produce silicon-silicon bonds, and finally conversion into silicon occurs. The halogen atom is usually a fluorine atom, chlorine atom, bromine atom, or iodine atom, and in view of the bond cleavage, chlorine and bromine are preferred. X may be a hydrogen atom alone or a halogen atom alone. A partially halogenated silane compound in which the total number of the hydrogen atom and the halogen atom is equal to m may be acceptable.

Furthermore, the silane compound may be modified with a group III or V element, such as boron or phosphorus, as necessary. Preferably, a modified silane compound which contains no carbon atoms is used. An example thereof is a modified silane compound represented by the general formula $Si_aX_bY_c$ (wherein X is a hydrogen atom and/or halogen atom, Y is a boron atom or phosphorus atom, a is an integer of 3 or more, b is an integer corresponding to a to 2a+c+2, and c is an integer corresponding to 1 to a). Herein, in view of thermodynamic stability, solubility, ease of refinement, etc., a modified silane compound with the sum of a and c being approximately 5 to 20, and in particular, 5 or 6, is preferably used. If a+c is less than 5, the modified silane compound itself becomes unstable due to strain of the ring, resulting in difficulty in handling. If a+c exceeds 20, solubility decreases due to the cohesive force of the modified silane compound, and the choice of the solvent used is narrowed.

In the general formula $Si_aX_bY_c$ of the modified silane compound, as in the case of the unmodified silane compound represented by the general formula $Si_nX_m$, X is a hydrogen atom and/or halogen atom, and usually is a fluorine atom, chlorine atom, bromine atom, or iodine atom. In view of the bond cleavage, chlorine and bromine are preferred. X may be a hydrogen atom alone or a halogen atom alone. A partially halogenated silane compound in which the total number of the hydrogen atom and the halogen atom is equal to b may be acceptable.

The solvent for the liquid containing the organic silicon compound preferably has a vapor pressure of 0.001 to 200 mmHg (approximately 0.133 to 26,600 Pa) at room temperature. If the vapor pressure is higher than 200 mmHg, the solvent rapidly vaporizes after discharging, and it is difficult to form a satisfactory film.

More preferably, the vapor pressure of the solvent is 0.001 to 50 mmHg (approximately 0.133 to 6,650 Pa). If the vapor pressure is higher than 50 mmHg, clogging easily occurs in the nozzle due to drying when droplets are discharged in the ink-jet process, resulting in difficulty in stable discharging.

On the other hand, if the solvent has a vapor pressure lower than 0.001 mmHg at room temperature, drying delays and the solvent easily remains in the film. As a result, after the subsequent heat treatment and/or phototreatment, it is difficult to obtain a high-quality conductive film.

The solvent used is not particularly limited as long as it dissolves the organic silicon compound. Examples thereof include, hydrocarbon solvents, such as n-heptane, n-octane, decane, toluene, xylene, cymene, durene, indene, dipentene, tetrahydronaphthalene, decahydronaphthalene, and cyclohexylbenzene; ether solvents, such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, and p-dioxane; and polar solvents, such as propylene carbonate, γ-butyrolactone, N-methyl-2-pyrrolidone, dimethylformamide, dimethyl sulfoxide, and cyclohexanone.

In view of solubility of the organic silicon compound and stability of the solution, preferred examples are hydrocarbon solvents and ether solvents, and more preferred examples are hydrocarbon solvents. These solvents may be used alone, or two or more of them may be combined for use.

When the organic silicon compound is dissolved in the solvent, the concentration of the dispersoid is 1% to 80% by mass and may be adjusted according to the desired thickness of the silicon film. If the concentration exceeds 80% by mass, aggregation easily occurs and it is difficult to obtain a uniform film.

The surface tension of the organic silicon compound solution is preferably in the range of 0.02 to 0.07 N/m. When the liquid is discharged by the ink-jet process, if the surface tension is less than 0.02 N/m, the wettability of the ink composition to the nozzle surface increases, and flight curving easily occurs. If the surface tension exceeds 0.07 N/m, the shape of the meniscus at the nozzle tip becomes unstable, resulting in difficulty in controlling the amount and timing of the discharge.

In order to adjust the surface tension, a surface tension adjuster, such as a fluorochemical, silicone, or nonionic surface tension adjuster, may be added to the solution in a slight amount so as not to decrease the contact angle with the substrate excessively. The nonionic surface tension adjuster improves the wettability of the liquid to the substrate, improves the leveling property of the film, and prevents the graininess and orange peel surface of the coated film.

The solution may contain an organic compound, such as an alcohol, ether, or ketone, as necessary.

The viscosity of the solution is preferably 1 to 50 mPa·s. When discharging is performed by the ink-jet process, if the viscosity is less than 1 mPa·s, the periphery of the nozzle is easily contaminated by the spill of ink. If the viscosity exceeds 50 mPa·s, the frequency of nozzle port clogging increases, and it becomes difficult to discharge droplets smoothly.

In this exemplary embodiment, droplets of the solution are ejected from an inkjet head to drop on the substrate at the location where wiring is formed. In order to avoid generation of liquid pools (bulges), the degree of overlap between continuously discharged droplets must be controlled. A discharge method may be employed in which a plurality of droplets are discharged so as not to come into contact with each other by first discharging, and the spaces therebetween are filled by second and subsequent discharging.

After the droplets are discharged, in order to remove the solvent, a drying process is performed as necessary. For example, the drying process may be performed using an ordinary hot plate to heat a substrate W, an electric furnace, or the like, or by lamp annealing. The light source used for lamp annealing is not particularly limited. For example, an infrared lamp, xenon lamp, YAG laser, argon laser, carbon dioxide gas laser, or an excimer laser using XeF, XeCl, XeBr, KrF, KrCl, ArF, ArCl, or the like, may be used as the light source. The light source with an output in the range of 10 to 5,000 W is usually used. In this exemplary embodiment, the output in the range of 100 to 1,000 W is sufficient.

(Heat Treatment/Phototreatment)

With respect to the solution after the discharge is performed, the solvent must be removed and the organic silicon compound must be converted into amorphous or polycrystalline silicon. For that purpose, the substrate is subjected to heat treatment and/or phototreatment after the discharge is performed.

The heat treatment and/or phototreatment may be performed in an inert gas atmosphere, such as nitrogen, argon, or helium. The treating temperature of the heat treatment and/or phototreatment is appropriately set in consideration of the boiling point (vapor pressure) of the dispersion medium, the type and pressure of the atmospheric gas, thermal behavior, such as dispersibility and oxidizing property, of the fine particles, use of a coating agent, the amount of the coating agent if used, the heat-resisting temperature of the substrate, etc.

The treatment is usually performed in an argon atmosphere or in argon containing hydrogen at approximately 100 to 800° C., preferably at approximately 200 to 600° C., and more preferably at approximately 300 to 500° C. Generally, at an ultimate temperature of approximately 550° C. or less, an amorphous silicon film is obtained, and at temperatures higher than that, a polycrystalline silicon film is obtained. If the ultimate temperature is less than 300° C., the organic silicon compound is not pyrolyzed sufficiently, and in some cases, it is not possible to form a silicon film with a sufficient thickness. In order to obtain a polycrystalline silicon film, the amorphous silicon film obtained as described above may be converted into a polycrystalline silicon film by laser annealing. The laser annealing is performed preferably in an inert atmosphere, such as helium or argon, or the inert atmosphere to which a reducing gas such as hydrogen is optionally mixed.

The heat treatment and/or phototreatment may be performed using an ordinary hot plate, electric furnace, or the like, or by lamp annealing. The light source used for lamp annealing is not particularly limited. For example, an infrared lamp, xenon lamp, YAG laser, argon laser, carbon dioxide gas laser, or an excimer laser using XeF, XeCl, XeBr, KrF, KrCl, ArF, ArCl, or the like, may be used as the light source. The light source with an output in the range of 10 to 5,000 W is usually used. In this exemplary embodiment, the output in the range of 100 to 1,000 W is sufficient.

The solution after the discharge is converted into an amorphous or polycrystalline silicon film by the step described above.

With respect to the silicon film pattern formed in this exemplary embodiment, since a substrate having properly adjusted lyophobicity is used, thin lines and thick films can be formed without generating bulges.

Consequently, in this exemplary embodiment, it is possible to form a fine pattern with a desired thickness.

[Fourth Exemplary Embodiment]

A liquid crystal device as an example of the electro-optical device of the present invention is described in a fourth exemplary embodiment. FIG. 1 shows a planar layout of signal electrodes, etc., on a first substrate of the liquid crystal device in this exemplary embodiment. The liquid crystal device in this embodiment basically includes the first substrate, a second substrate (not shown in the drawing) provided with scanning electrodes, etc., and liquid crystal (not shown in the drawing) enclosed between the first substrate and the second substrate.

As shown in FIG. 1, a plurality of signal electrodes 310 are arrayed in a multiple matrix in a pixel region 303 on a first substrate 300. Each signal electrode 310 includes a plurality of pixel electrode portions 310a corresponding to the individual pixels and signal line portions 310b connecting them in a multiple matrix, and extends in a Y direction.

Reference numeral 350 represents a liquid crystal driving circuit having a chip structure, and the liquid crystal driving circuit 350 and one end (lower end in the drawing) of the signal line portion 310b are connected to each other through a first lead 331.

Reference numeral 340 represents a vertically conducting terminal, and the vertically conducting terminal 340 and a terminal provided on the second substrate which is not shown in the drawing are connected to each other by a vertically conducting member 341. The vertically conducting terminal 340 and the liquid crystal driving circuit 350 are connected with each other through a second lead 332.

In this exemplary embodiment, each of the signal line portions 310b, the first leads 331, and the second leads 332 is formed on the first substrate 300 by the method of forming wiring in accordance with the second embodiment.

In the liquid crystal device in this exemplary embodiment, defects, such as disconnections and short-circuiting, do not easily occur in the individual wiring sections, and it is possible to fabricate a compact, thin liquid crystal device.

Additionally, when switching elements composed of TFDs (Thin Film Diodes) are formed on one of the substrates, a stripe-shaped electrode is formed on the other substrate. In such a case, the stripe-shaped electrode (counter electrode) may be formed by the method for forming wiring.

When switching elements composed of thin-film transistors are formed on one of the substrates, a counter electrode is formed over substantially the entire surface of the other substrate. In such a structure, the counter electrode (full-face electrode) may also be formed by an ink-jet process.

When switching elements are provided as described above, an electrode is formed on the counter substrate. The electrode may be formed on the counter substrate using at least 1) performing lyophobic treatment on the counter substrate, 2) decreasing the lyophobicity (or performing lyophilic treatment, and 3) applying a metal material to the substrate by an ink-jet process to form the electrode.

The liquid crystal device with the electrodes is described above. This process is also applicable to a liquid crystal device provided with thin-film transistors.

That is, as in the process described above, a substrate is subjected to lyophobic treatment, followed by lyophilic treatment. Electrodes are then formed by a step of applying a metal material on the substrate. Instead of forming the electrodes, for example, gate electrodes of thin-film transistors (TFTs) may be formed.

Specifically, the gate electrodes constituting the TFTs and gate lines are formed by an ink-jet process. After the gate electrodes are formed, source regions, gate regions, etc., may be formed with an insulating film therebetween. Thin-film transistors are thereby produced.

Since the gate electrodes constituting the TFTs and the gate lines electrically connected to the gate electrodes can be simultaneously formed by the ink-jet process, the fabrication process is simplified. This process is particularly effective to a bottom gate. In the substrate, regions in which gate electrodes are formed and regions corresponding to the regions in which gate lines are formed may be preliminarily hollowed out to form trenches. By combining the lyophilic treatment and the lyophobic treatment, a finer pattern (electrode pattern) can be formed.

Although the liquid crystal device has been described as an example, in addition to the liquid crystal device, the present invention is applicable to an organic EL device including organic EL elements.

Specifically, the same structure and process as those of the substrate on which the thin-film transistors described above are formed may be applied to an organic EL device.

[Fifth Exemplary Embodiment]

Figure 2:
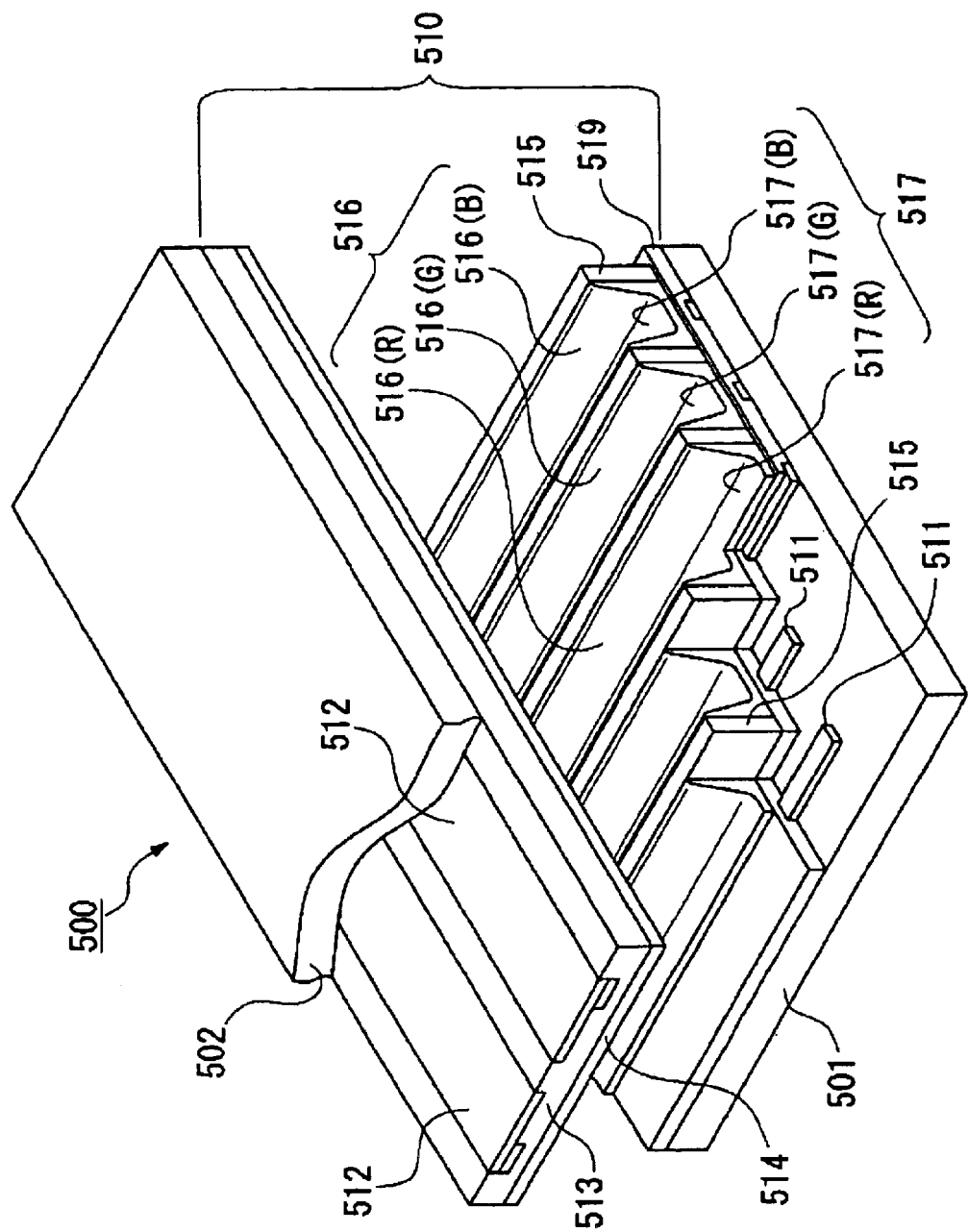
FIG. 2 is an exploded perspective view of a plasma display device in a fifth exemplary embodiment.

In a fifth exemplary embodiment, a plasma display device is described as an example of the electro-optical device of the present invention. FIG. 2 is an exploded perspective view of a plasma display device 500 in this exemplary embodiment.

The plasma display device 500 in this exemplary embodiment basically includes a glass substrate 501 and a glass substrate 502 which are opposed to each other, and a discharge display area 510 disposed between the two substrates.

The discharge display area 510 includes a plurality of discharge chambers 516, and they are arrayed so that a red discharge chamber 516(R), a green discharge chamber 516(G), and a blue discharge chamber 516(B) constitute one pixel.

Address electrodes 511 are formed in a striped shape with a predetermined distance therebetween on the upper surface of the (glass) substrate 501. A dielectric layer 519 is formed so as to cover the address electrodes 511 and the upper surface of the substrate 501, and partitions 515 are formed between and along the address electrodes 511 on the dielectric layer 519. Additionally, partitions are also formed in a direction orthogonal to the longitudinal direction of the address electrodes 511 at predetermined positions with a predetermined distance therebetween (not shown in the drawing). Basically, a rectangular region is formed by the adjacent two partitions at both sides in the width direction of the address electrode 511 and the partitions extending in the direction orthogonal to the direction of the address electrode 511. The discharge chamber 516 is formed so as to correspond to each rectangular region, and the three rectangular regions constitute one pixel. Phosphors 517 are placed in the rectangular regions delimited by the partitions 515. The phosphor 517 generates any one of red, green, and blue. A red phosphor 517(R) is disposed on the bottom of the red discharge chamber 516(R), a green phosphor 517(G) is disposed on the bottom of the green discharge chamber 516(G), and a blue phosphor 517(B) is disposed on the bottom of the blue discharge chamber 516(B).

A plurality of display electrodes 512 are disposed with a predetermined distance therebetween on the glass substrate 502 in a direction orthogonal to the address electrodes 511. A dielectric layer 513 is formed so as to cover them, and a protective film 514 composed of MgO or the like is formed further thereon.

The substrate 501 and the glass substrate 502 are bonded to each other so that the address electrodes 511 and the display electrodes 512 are orthogonal each other. Spaces surrounded by the substrate 501, the partitions 515, and the protective film 514 on the side of the glass substrate 502 are evacuated and filled with a noble gas, and the discharge chambers 516 are thereby formed. Additionally, two display electrodes 512, which are provided on the glass substrate 502, are placed for each discharge chamber 516.

The address electrodes 511 and the display electrodes 512 are connected to an alternating-current power supply (not shown in the drawing) and a current is applied to each electrode. The phosphors 517 are thereby excited to perform color display at necessary positions in the discharge area 510.

In this exemplary embodiment, each of the address electrodes 511 and the display electrodes 512 is formed by the method of forming wiring in accordance with the second exemplary embodiment.

In the liquid device in this exemplary embodiment, defects, such as disconnections and short-circuiting, do not easily occur in the electrodes, and moreover, it is possible to produce a compact, thin plasma display device.

[Sixth Exemplary Embodiment]

In a sixth exemplary embodiment, specific examples of the electronic apparatus will be described.

Figure 3:
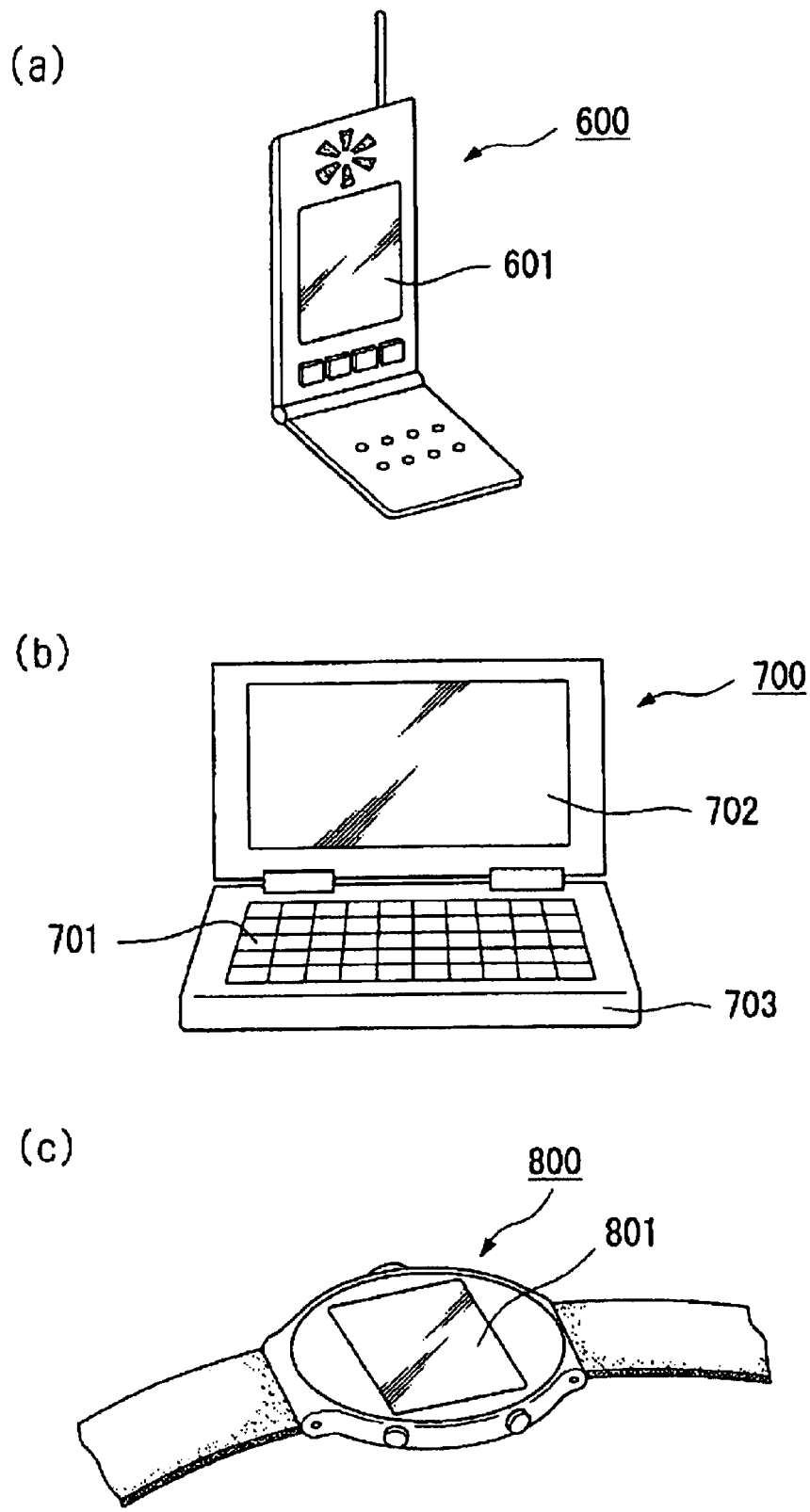
FIGS. 3(a) to 3(c) are schematics showing electronic apparatuses in a sixth exemplary embodiment; where

FIG. 3(a) is a perspective view of a mobile phone. In FIG. 3(a), reference numeral 600 represents a mobile phone body, and reference numeral 601 represents a liquid display area provided with a liquid crystal device in accordance with the fourth embodiment.

FIG. 3(b) is a perspective view of a portable information processing device, such as a word processor or personal computer. In FIG. 3(b), reference numeral 700 represents an information processing device, reference numeral 701 represents an input unit, such as a keyboard, reference numeral 703 represents an information processor body, and reference numeral 702 represents a liquid crystal device (or an organic EL device) in accordance with the fourth embodiment.

FIG. 3(c) is a perspective view of a wristwatch-type electronic apparatus. In FIG. 3(c), reference numeral 800 represents a watch body, and reference numeral 801 represents a liquid display area provided with a liquid crystal device in accordance with the fourth embodiment.

Since the electronic apparatuses shown in FIGS. 3(a) to 3(c) are provided with the liquid crystal devices (or organic EL devices) in accordance with the embodiment, defects, such as disconnections and short-circuiting, do not easily occur, and moreover, miniaturization and thickness reduction are enabled.

In this exemplary embodiment, the electronic apparatuses are provided with liquid crystal devices. Electronic apparatuses may be provided with other electro-optical devices, such as organic electroluminescent display devices, or plasma display devices, for example.

[Seventh Exemplary Embodiment]

Figure 4:
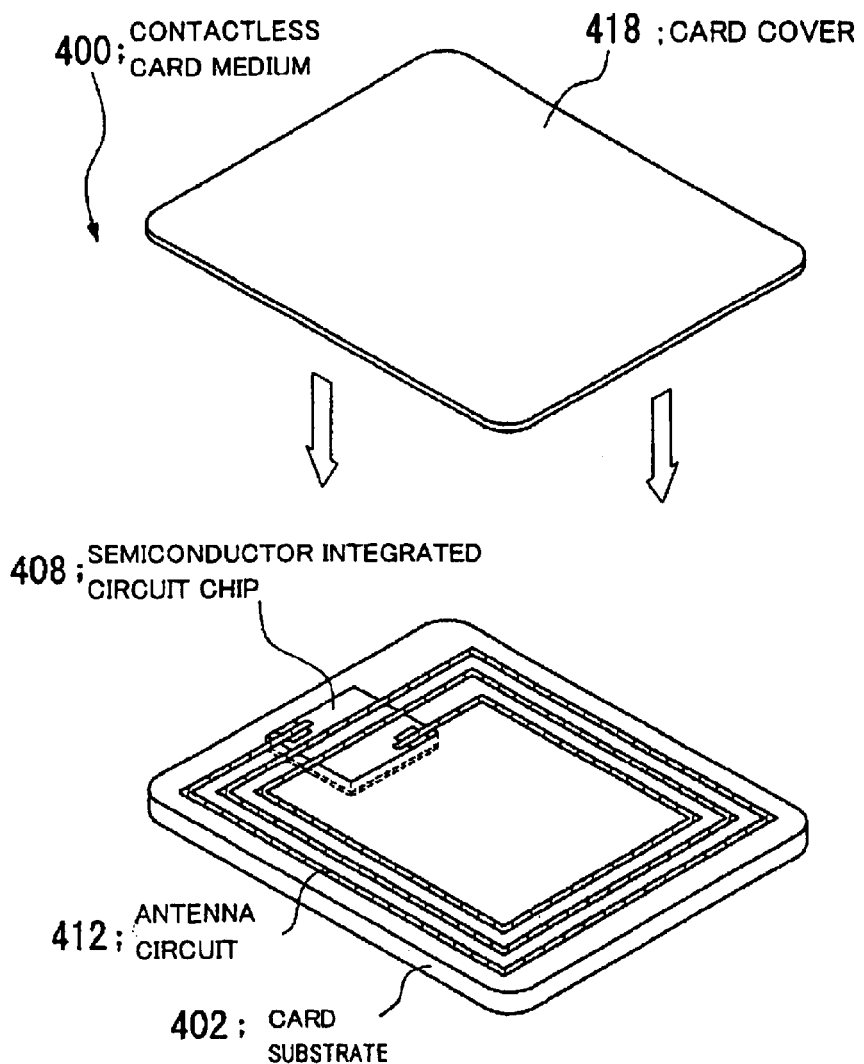
FIG. 4 is an exploded perspective view of a contactless card medium in a seventh exemplary embodiment.

In a fifth exemplary embodiment, a contactless card medium of the present invention is described. As shown in FIG. 4, a contactless card medium 400 in accordance with this exemplary embodiment includes a housing comprising a card substrate 402 and a card cover 418, and a semiconductor integrated circuit chip 408 and an antenna circuit 412 are built in the housing. The contactless card medium 400 and an external transceiver (not shown in the drawing) perform power supply or at least one of data transmittance and receipt by at least one of electromagnetic wave and capacitive coupling.

In this exemplary embodiment, the antenna circuit 412 is formed by the method of forming wiring in accordance with the second exemplary embodiment.

In accordance with the contactless card medium in this exemplary embodiment, defects, such as disconnections and short-circuiting, do not easily occur in the antenna circuit 412, and moreover, it is possible to produce a compact, thin contactless card medium.

EXAMPLES

Example 1

The surface of a glass substrate on which an ITO (Indium Tin Oxide) layer was formed was subjected to pretreatment and lyophobic treatment, followed by lyophilic treatment.

In order to perform the pretreatment, the surface of the substrate was irradiated with ultraviolet light and cleaned with a solvent.

The lyophobic treatment was performed by forming a monomolecular layer of FAS. Specifically, heptadecafluoro-1,1,2,2-tetrahydrodecyltriethoxysilane was used as the compound to form a self-assembled layer. The compound and the substrate were placed in the same sealed container and left to stand for 2 hours at 120° C.

The lyophilic treatment was performed by irradiation of ultraviolet light with a wavelength of 254 nm. The ultraviolet irradiation was performed on several substrates by varying the irradiation time.

The lyophobicity of the substrates which were irradiated with ultraviolet light for different irradiation periods were measured as the contact angle to pure water. The results thereof are shown in Table 1.

TABLE 1

| Irradiation time (second) | Contact angle [deg] |
| --- | --- |
| 0 | 120 |
| 15 | 110 |
| 60 | 90 |
| 90 | 75 |
| 120 | 50 |
| 150 | 20 |

Example 2

The surface of a glass substrate was subjected to pretreatment and lyophobic treatment, followed by lyophilic treatment.

In order to perform the pretreatment, the surface of the substrate was irradiated with ultraviolet light and cleaned with a solvent.

The lyophobic treatment was performed by forming a monomolecular layer of FAS. Specifically, heptadecafluoro-1,1,2,2-tetrahydrodecyltriethoxysilane was used as the compound for forming a self-assembled layer. The compound and the substrate were placed in the same sealed container and left to stand for 2 hours at 120° C.

The lyophilic treatment was performed by irradiation of ultraviolet light with a wavelength of 254 nm. The ultraviolet irradiation was performed on several substrates by varying the irradiation time.

The lyophobicity of the substrates which were irradiated with ultraviolet light for different irradiation periods were measured as the contact angle to pure water. The results thereof are shown in Table 2.

TABLE 2

| Irradiation time (second) | Contact angle [deg] |
| --- | --- |
| 0 | 110 |
| 15 | 93 |
| 60 | 50 |
| 90 | 12 |

Example 3

The surface of a silicon wafer substrate was subjected to pretreatment and lyophobic treatment, followed by lyophilic treatment.

The pretreatment was performed by ultraviolet irradiation.

The lyophobic treatment was performed by forming a fluorinated polymer film. Specifically, a mixture of methane tetrafluoride, argon, and $C_8F_{18}$ was used as a reactant gas. The treatment was carried out with a gas flow of 440 sccm, and at a plasma power of 1.6 kW, a substrate temperature of 60° C., and a treatment time of 30 minutes.

The lyophilic treatment was performed by irradiation of ultraviolet light with a wavelength of 254 nm. The ultraviolet irradiation was performed on several substrates by varying the irradiation time.

The lyophobicity of the substrates which were irradiated with ultraviolet light for different irradiation periods were measured as the contact angle to solvent-based pigment ink. The results thereof are shown in Table 3.

TABLE 3

| Irradiation time (second) | Contact angle [deg] |
| --- | --- |
| 0 | 70 |
| 300 | 30 |
| 600 | 20 |
| 900 | 20 |
| 1,200 | 20 |

[Advantages]

As described above, in accordance with the surface treatment method of the present invention, since lyophilic treatment is performed after lyophobic treatment, it is possible to obtain a substrate having desired uniform lyophilicity.

Consequently, by using a substrate which is treated by the surface treatment method of the present invention, it is possible to form a desired film pattern accurately, which is suitable for the formation of a conductive wiring film, etc.

In accordance with the present invention, it is possible to provide a compact, thin electro-optical device in which defects, such as disconnections and short-circuiting, do not easily occur in wiring and antenna sections, an electronic apparatus including the same, and a contactless card medium.

What is claimed is:

1. A surface treatment method, comprising:
    performing lyophobic treatment on a surface of a substrate; and
    subsequently performing lyophilic treatment.

2. The surface treatment method according to claim 1, lyophobic treatment including forming a lyophobic monomolecular layer on the surface of the substrate.

3. The surface treatment method according to claim 2, the lyophobic monomolecular layer being a self-assembled layer including organic molecules.

4. The surface treatment method according to claim 1, the lyophobic treatment including forming a fluorinated polymer layer on the surface of the substrate.

5. The surface treatment according to claim 4, further including forming the fluorinated polymer layer by plasma treatment using a fluorocarbon compound as a reactant gas.

6. The surface treatment method according to claim 1, the lyophilic treatment including performing ultraviolet irradiation.

7. The surface treatment method according to claim 1, the lyophilic treatment including performing plasma treatment using oxygen as a reactant gas.

8. The surface treatment method according to claim 1, the lyophilic treatment including exposing the substrate to an ozone atmosphere.

9. A surface-treated substrate obtained by the surface treatment method according to claim 1.

10. A method of forming a film pattern, comprising:
   performing lyophobic treatment on a surface of a substrate;
   performing lyophilic treatment on a part of the region subjected to the lyophobic treatment; and
   discharging droplets of a liquid containing a component to form the film onto the surface-treated substrate.

11. A method of forming a metal wiring pattern, comprising:
   performing lyophobic treatment on a surface of a substrate;
   performing lyophilic treatment on a part of the region subjected to the lyophobic treatment; and
   discharging droplets of a liquid containing a component to form the metal wiring onto the surface-treated substrate.

12. A conductive wiring film formed by the method of forming a metal wiring pattern according to claim 11.

13. An electro-optical device, comprising:
   the conductive wiring film according to claim 12.

14. A method of making an electro-optical device that includes a substrate provided with electrodes, the method comprising:
   performing lyophobic treatment on a surface of the substrate;
   performing lyophilic treatment on a part of the region subjected to the lyophobic treatment; and
   discharging droplets of a liquid containing a component to form metal wiring onto the surface-treated substrate to form the electrodes.

15. A method of making an electro-optical device that includes a substrate provided with thin-film transistors, the method comprising:
   performing lyophobic treatment on a surface of the substrate;
   performing lyophilic treatment on a part of the region subjected to the lyophobic treatment; and
   discharging droplets of a liquid containing a component to form metal wiring onto the surface-treated substrate to form the thin-film transistors.

16. An electronic apparatus, comprising:
   the electro-optical device according to claim 14.

17. A contactless card medium, comprising:
   the conductive wiring film according to claim 12, the conductive wiring film functioning as an antenna circuit.

* * * * *